(12) United States Patent
Tu et al.

(10) Patent No.: US 10,147,899 B2
(45) Date of Patent: Dec. 4, 2018

(54) TANDEM ORGANIC ELECTROLUMINESCENT ELEMENT

(71) Applicant: Shenzhen China Star Optoelectronics Technology Co., Ltd., Shenzhen (CN)

(72) Inventors: Aiguo Tu, Shenzhen (CN); Wei Yuan, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/540,033

(22) PCT Filed: Feb. 15, 2017

(86) PCT No.: PCT/CN2017/073636
§ 371 (c)(1),
(2) Date: Jun. 27, 2017

(87) PCT Pub. No.: WO2018/120369
PCT Pub. Date: Jul. 5, 2018

(65) Prior Publication Data
US 2018/0269419 A1     Sep. 20, 2018

(30) Foreign Application Priority Data
Dec. 29, 2016  (CN) .......................... 2016 1 1244944

(51) Int. Cl.
*H01L 51/52*    (2006.01)
*H01L 27/32*    (2006.01)
*H01L 51/50*    (2006.01)

(52) U.S. Cl.
CPC ...... *H01L 51/5056* (2013.01); *H01L 27/3209* (2013.01); *H01L 51/5076* (2013.01); *H01L 51/5206* (2013.01); *H01L 51/5221* (2013.01)

(58) Field of Classification Search
None
See application file for complete search history.

(56) References Cited

U.S. PATENT DOCUMENTS 9,761,823 B2 * 9/2017 Jeon .................. H01L 51/508
2014/0103306 A1 * 4/2014 Moon ................ H01L 51/0052
                                                                  257/40

(Continued)

FOREIGN PATENT DOCUMENTS

CN        1753592 A       3/2006
CN      103165817 A       6/2013

OTHER PUBLICATIONS

Sun, Chieh-Tze, et al. "Electron Injection and Transport Mechanisms of an Electron Transport Layer in OLEDs." Journal of the Electrochemical Society, vol. 158, No. 12, 2011, doi:10.1149/2.070112jes.*

Primary Examiner — Joseph Schoenholtz
(74) Attorney, Agent, or Firm — Leong C. Lei

(57) ABSTRACT

Provided is a tandem organic electroluminescent element, comprising a first electrode, a first light emitting unit, a third electron transporting layer, a second electron transporting layer, a first electron transporting layer, a charge generation layer, a second light emitting unit and a second electrode which are stacked up from bottom to top; both the first electron transporting layer and the second electron transporting layer comprising n type dopant, and a concentration of the n type dopant in the first electron transporting layer being larger than a concentration of the n type dopant in the second electron transporting layer, and the third electron transporting layer comprising no n type dopant; the arrangement of the first, the second and the third electron transporting layers can reduce the energy barrier of injecting (Continued)

electrons into the first light emitting unit by the charge generation layer to make the electrons easy to be injected.

17 Claims, 2 Drawing Sheets

(56) References Cited

U.S. PATENT DOCUMENTS

2017/0098782 A1* 4/2017 Choi .................... H01L 51/508
2018/0006224 A1* 1/2018 Lee ..................... H01L 51/0072
2018/0145263 A1* 5/2018 Denker ................ C07D 401/14

* cited by examiner

TANDEM ORGANIC ELECTROLUMINESCENT ELEMENT

FIELD OF THE INVENTION

The present invention relates to a display technology field, and more particularly to a tandem organic electroluminescent element.

BACKGROUND OF THE INVENTION

The Organic Light Emitting Display (OLED) device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

The OLED display element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, the Indium Tin Oxide (ITO) electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

Recently, the tandem organic electroluminescent element is gaining more and more attention from the academia and the industry with its excellent current efficiency, luminance and working life. The tandem organic electroluminescent element generally comprises a plurality of light emitting units, and the plurality of light emitting units are connected by a charge generation layer, and the light emissions thereof do not affect with each other. The biggest advantage of the tandem organic electroluminescent element is that its brightness and current efficiency can be greatly improved. The existing research results showed that the brightness and the current efficiency of the tandem organic electroluminescent element are directly proportional to the number of layers.

However, similar to the single layer organic electroluminescent element, the tandem organic electroluminescent element also has the problem of life attenuation. The lifetime attenuation of the tandem organic electroluminescent element generally includes the lifetime attenuation of the respective light emitting units and the lifetime attenuation of the charge generation layer. The lifetime attenuation of the charge generation layer will further cause the attenuation of the luminance of one or more of the light emitting units, and consequently, result in a larger color shift after the prolonged use of the tandem organic electroluminescent element.

SUMMARY OF THE INVENTION

An objective of the present invention is to provide a tandem organic electroluminescent element, of which the service life is longer and the speed of the element color drift is slower.

For realizing the aforesaid objective, the present invention provides a tandem organic electroluminescent element, comprising a first electrode, a first light emitting unit, a third electron transporting layer, a second electron transporting layer, a first electron transporting layer, a charge generation layer, a second light emitting unit and a second electrode which are stacked up from bottom to top;

both the first electron transporting layer and the second electron transporting layer comprising n type dopant, and a concentration of the n type dopant in the first electron transporting layer being larger than a concentration of the n type dopant in the second electron transporting layer, and the third electron transporting layer comprising no n type dopant.

The concentration of the n type dopant in the first electron transporting layer is 1 wt %--20 wt %, and the concentration of the n type dopant in the second electron transporting layer is 1 wt %-10 wt %.

The n type dopant comprises at least one of an alkali metal, an alkaline earth metal, a rare earth metal, and a metal compound of the aforesaid metals.

The n type dopant comprises at least one of lithium, sodium, potassium, rubidium, cesium, francium, beryllium, magnesium, calcium, barium, radium, lanthanum, cerium, strontium, neodymium, samarium, europium, terbium, thorium, dysprosium, holmium, erbium, gadolinium, ytterbium, lutetium, yttrium, manganese, and a metal compound of the aforesaid metals.

All the first electron transporting layer, the second electron transporting layer and the third electron transporting layer comprise a host material, and the host material comprises at least one of 4,7-diphenyl-1,10-phenanthroline and 8-hydroxyquinoline aluminum salt.

A material of the first electron transporting layer and the second electron transporting layer is 4,7-diphenyl-1,10-phenanthroline doped with lithium, and a doping concentration of lithium in the first electron transporting layer is 10 wt %, and a doping concentration of lithium in the second electron transporting layer is 5 wt %; a material of the third electron transporting layer is 8-hydroxyquinoline aluminum salt.

The first electrode is an anode, and the second electrode is a cathode.

The charge generation layer comprises an n type charge generation layer disposed adjacent to the first electron transport layer and a p type charge generation layer disposed adjacent to the second light emitting unit.

A material of the n type charge generation layer is Hexanitrilehexaazatriphenylene, and a material of the p type charge generation layer is N,N'-bis(naphthalen-1-yl)-N,N'-bis(phenyl)benzidine.

Preferably, the tandem organic electroluminescent element further comprises at least one light emitting unit disposed between the second light emitting unit and the second electrode, and in the second light emitting unit and the at least one light emitting unit, the third electron transporting layer, the second electron transporting layer, the first electron transporting layer and the charge generation layer which are stacked up from bottom to top are disposed between every two adjacent light emitting units.

The present invention further provides a tandem organic electroluminescent element, comprising a first electrode, a first light emitting unit, a third electron transporting layer, a second electron transporting layer, a first electron transporting layer, a charge generation layer, a second light emitting unit and a second electrode which are stacked up from bottom to top;

both the first electron transporting layer and the second electron transporting layer comprising n type dopant, and a concentration of the n type dopant in the first electron transporting layer being larger than a concentration of the n type dopant in the second electron transporting layer, and the third electron transporting layer comprising no n type dopant;

wherein the concentration of the n type dopant in the first electron transporting layer is 1 wt %-2 wt %, and the concentration of the n type dopant in the second electron transporting layer is 1wt %-10 wt %;

wherein the n type dopant comprises at least one of an alkali metal, an alkaline earth metal, a rare earth metal, and a metal compound of the aforesaid metals;

wherein all the first electron transporting layer, the second electron transporting layer and the third electron transporting layer comprise a host material, and the host material comprises at least one of 4,7-diphenyl-1,10-phenanthroline and 8-hydroxyquinoline aluminum salt.

The benefits of the present invention are: in the tandem organic electroluminescent element of the present invention, by arranging the first electron transporting layer, the second electron transporting layer and the third electron transporting layer, both the first electron transporting layer and the second electron transporting layer comprises n type dopant, and a concentration of the n type dopant in the first electron transporting layer is larger than a concentration of the n type dopant in the second electron transporting layer, and the third electron transporting layer comprises no n type dopant, and the arrangement of the first electron transporting layer, the second electron transporting layer and the third electron transporting layer can reduce the energy barrier of injecting electrons into the first light emitting unit by the charge generation layer to make the electrons easy to be injected, and thus to reduce the drive voltage and to improve the element efficiency and can increase the service life of the device and slow down the speed of device color drift.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
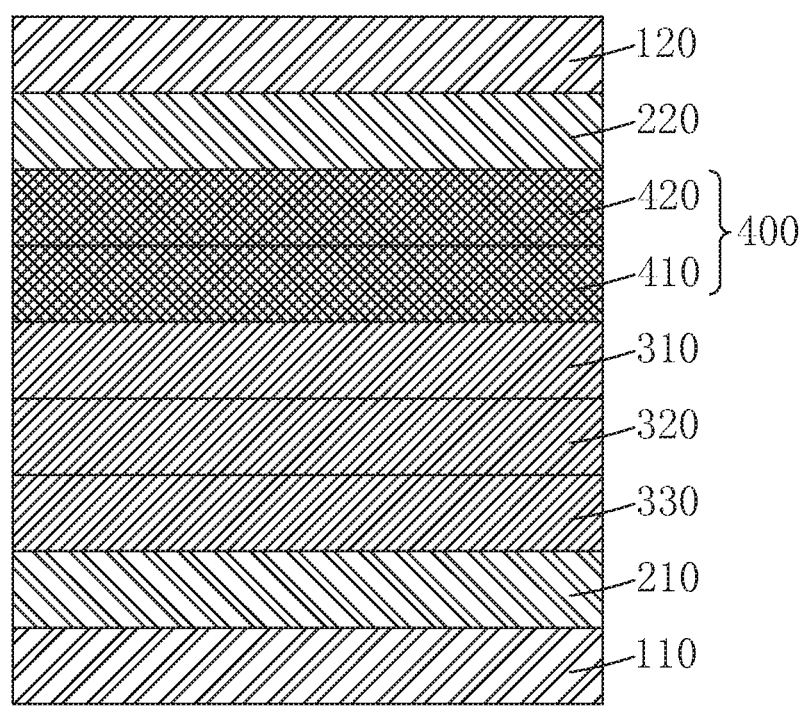
FIG. 1 is a structure diagram of a tandem organic electroluminescent element of the present invention.

Please refer to FIG. 1. The present invention provides a tandem organic electroluminescent element, comprising a first electrode 110, a first light emitting unit 210, a third electron transporting layer 330, a second electron transporting layer 320, a first electron transporting layer 310, a charge generation layer 400, a second light emitting unit 220 and a second electrode 120 which are stacked up from bottom to top;

both the first electron transporting layer 310 and the second electron transporting layer 320 comprising n type dopant, and a concentration of the n type dopant in the first electron transporting layer 310 being larger than a concentration of the n type dopant in the second electron transporting layer 320, and the third electron transporting layer 330 comprising no n type dopant.

In the tandem organic electroluminescent element of the present invention, the first electron transporting layer 310, the second electron transporting layer 320 and the third electron transporting layer 330 arranged between the charge generation layer 400 and the first light emitting unit 210 serve to transport the electrons in the charge generation layer 400 to the first light emitting unit 210. By doping the n type dopant in the first electron transporting layer 310 and the second electron transporting layer 320, the electronic transmission performances of the first electron transporting layer 310 and the second electron transporting layer 320 can be improved. By forming the gradient of the n type dopant content gradually reduced to zero in the first electron transporting layer 310, the second electron transporting layer 320 and the third electron transporting layer 330, the energy barrier of injecting electrons into the first light emitting unit 210 by the charge generation layer 400 can be reduced to make the electrons easy to be injected, and thus to reduce the drive voltage and to improve the element efficiency.

Specifically, the concentration of the n type dopant in the first electron transporting layer 310 is 1 wt %-20 wt %, and the concentration of the n type dopant in the second electron transporting layer 320 is 1 wt % -10 wt %.

Specifically, the n type dopant comprises at least one of an alkali metal, an alkaline earth metal, a rare earth metal, and a metal compound of the aforesaid metals.

Preferably, the n type dopant comprises at least one of lithium (Li), sodium (Na), potassium (K), rubidium (Rb), cesium (Cs), francium (Fr), beryllium (Be), magnesium (Mg), calcium (Ca), barium (Ba), radium (Ra), lanthanum (La), cerium (Ce), strontium (Pr), neodymium (Nd), samarium (Sm), europium (Eu), terbium (Tb), thorium (Th), dysprosium (Dy), holmium (Ho), erbium (Er), gadolinium (Gd), ytterbium (Yb), lutetium (Lu), yttrium (Y), manganese (Mn), and a metal compound of the aforesaid metals.

Specifically, all the first electron transporting layer 310, the second electron transporting layer 320 and the third electron transporting layer 330 comprise a host material acting the function of electronic transmission, and the host material comprises at least one of 4,7-diphenyl-1,10-phenanthroline (Bphen) and 8-hydroxyquinoline aluminum salt (Alq3).

In one preferred embodiment of the present invention, a material of the first electron transporting layer 310 and the second electron transporting layer 320 is 4,7-diphenyl-1,10-phenanthroline doped with lithium, and a doping concentration of lithium in the first electron transporting layer 310 is 10 wt %, and a doping concentration of lithium in the second electron transporting layer 320 is 5 wt %; a material of the third electron transporting layer 330 is 8-hydroxyquinoline aluminum salt; all the thicknesses of the first electron transporting layer 310, the second electron transporting layer 320 and the third electron transporting layer 330 are 10 nm.

Specifically, the first electrode 110 is an anode, and the second electrode 120 is a cathode.

Specifically, the charge generation layer 400 comprises an n type charge generation layer 410 disposed adjacent to the first electron transport layer 310 and a p type charge generation layer 420 disposed adjacent to the second light emitting unit 220.

Preferably, a material of the n type charge generation layer 410 is Hexanitrilehexaazatriphenylene (HATCN), and a material of the P type charge generation layer 420 is N,N'-bis(naphthalen-1-yl)-N,N'-bis(phenyl)benzidine (NPB). A thickness of the n type charge generation layer 410 is 20 nm, and a thickness of the P type charge generation layer 420 is 30 nm.

Specifically, the first light emitting unit 210 and the second light emitting unit 220 respectively comprise one or more light emitting layers. A material of the light emitting layers comprises at least one of 8-hydroxyquinoline aluminum salt (Alq3), carbazole compound, polystyrene compounds, 10-hydroxybenzoquinoline metal compound, benzoxazoles, benzothiazole compounds, benzimidazole compound, polyfluorene and erythritene.

Selectably, the first light emitting unit 210 and the second light emitting unit 220 further comprise one or more organic material layers except the light emitting layers, respectively. The organic material layer comprises at least one of a hole blocking layer, a hole transporting layer, a hole injection layer, an electron blocking layer, an electron transporting layer and an electron injection layer.

Figure 2:
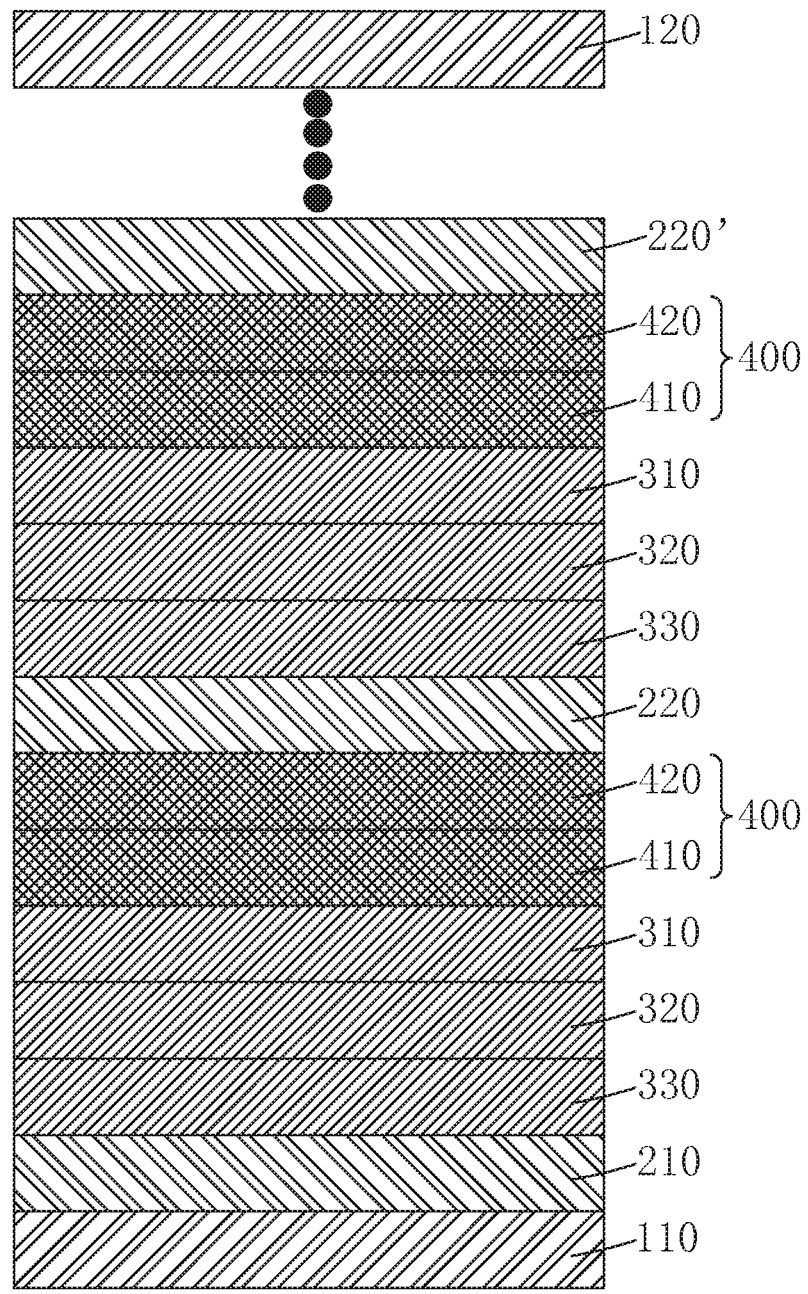
FIG. 2 is a structure diagram of a multilayer light emitting unit of a tandem organic electroluminescent element of the present invention.

Furthermore, referring to FIG. 2, the tandem organic electroluminescent element of the present invention can further comprise at least one light emitting unit 220' disposed between the second light emitting unit 220 and the second electrode 120, and in the second light emitting unit 220 and the at least one light emitting unit 220', the third electron transporting layer 330, the second electron transporting layer 320, the first electron transporting layer 310 and the charge generation layer 400 which are stacked up from bottom to top are disposed between every two adjacent light emitting units to increase the amount of the layers of the light emitting unit in the tandem organic electroluminescent element to raise the luminance of the tandem organic electroluminescent element.

In conclusion, in the tandem organic electroluminescent element of the present invention, by arranging the first electron transporting layer, the second electron transporting layer and the third electron transporting layer, both the first electron transporting layer and the second electron transporting layer comprises n type dopant, and a concentration of the n type dopant in the first electron transporting layer is larger than a concentration of the n type dopant in the second electron transporting layer, and the third electron transporting layer comprises no n type dopant, and the arrangement of the first electron transporting layer, the second electron transporting layer and the third electron transporting layer can reduce the energy barrier of injecting electrons into the first light emitting unit by the charge generation layer to make the electrons easy to be injected, and thus to reduce the drive voltage and to improve the element efficiency and can increase the service life of the device and slow down the speed of device color drift.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A tandem organic electroluminescent element, comprising a first electrode, a first light emitting unit, a third electron transporting layer, a second electron transporting layer, a first electron transporting layer, a charge generation layer, a second light emitting unit and a second electrode which are stacked up from bottom to top;
both the first electron transporting layer and the second electron transporting layer comprising n type dopant, and a concentration of the n type dopant in the first electron transporting layer being larger than a concentration of the n type dopant in the second electron transporting layer, and the third electron transporting layer comprising no n type dopant.

2. The tandem organic electroluminescent element according to claim 1, wherein the concentration of the n type dopant in the first electron transporting layer is 1 wt %-20 wt %, and the concentration of the n type dopant in the second electron transporting layer is 1 wt %-10 wt %.

3. The tandem organic electroluminescent element according to claim 1, wherein the n type dopant comprises at least one of an alkali metal, an alkaline earth metal, a rare earth metal, and a metal compound of the aforesaid metals.

4. The tandem organic electroluminescent element according to claim 3, wherein the n type dopant comprises at least one of lithium, sodium, potassium, rubidium, cesium, francium, beryllium, magnesium, calcium, barium, radium, lanthanum, cerium, strontium, neodymium, samarium, europium, terbium, thorium, dysprosium, holmium, erbium, gadolinium, ytterbium, lutetium, yttrium, manganese, and a metal compound of the aforesaid metals.

5. The tandem organic electroluminescent element according to claim 1, wherein all the first electron transporting layer, the second electron transporting layer and the third electron transporting layer comprise a host material, and the host material comprises at least one of 4,7-diphenyl-1,10-phenanthroline and 8-hydroxyquinoline aluminum salt.

6. The tandem organic electroluminescent element according to claim 5, wherein a material of the first electron transporting layer and the second electron transporting layer is 4,7-diphenyl-1,10-phenanthroline doped with lithium, and a doping concentration of lithium in the first electron transporting layer is 10 wt %, and a doping concentration of lithium in the second electron transporting layer is 5 wt %; a material of the third electron transporting layer is 8-hydroxyquinoline aluminum salt.

7. The tandem organic electroluminescent element according to claim 1, wherein the first electrode is an anode, and the second electrode is a cathode.

8. The tandem organic electroluminescent element according to claim 1, wherein the charge generation layer comprises an n type charge generation layer disposed adjacent to the first electron transport layer and a p type charge generation layer disposed adjacent to the second light emitting unit.

9. The tandem organic electroluminescent element according to claim 8, wherein a material of the n type charge generation layer is Hexanitrilehexaazatriphenylene, and a material of the p type charge generation layer is N,N'-bis(naphthalen-1-yl)-N,N'-bis(phenyl)benzidine.

10. The tandem organic electroluminescent element according to claim 1, further comprising at least one light emitting unit disposed between the second light emitting unit and the second electrode, and in the second light emitting unit and the at least one light emitting unit, the third electron transporting layer, the second electron transporting layer, the first electron transporting layer and the charge generation layer which are stacked up from bottom to top are disposed between every two adjacent light emitting units.

11. A tandem organic electroluminescent element, comprising a first electrode, a first light emitting unit, a third electron transporting layer, a second electron transporting layer, a first electron transporting layer, a charge generation layer, a second light emitting unit and a second electrode which are stacked up from bottom to top;
both the first electron transporting layer and the second electron transporting layer comprising n type dopant, and a concentration of the n type dopant in the first electron transporting layer being larger than a concentration of the n type dopant in the second electron transporting layer, and the third electron transporting layer comprising no n type dopant;
wherein the concentration of the n type dopant in the first electron transporting layer is 1 wt %-20 wt %, and the concentration of the n type dopant in the second electron transporting layer is 1 wt %-10 wt %;
wherein the n type dopant comprises at least one of an alkali metal, an alkaline earth metal, a rare earth metal, and a metal compound of the aforesaid metals;
wherein all the first electron transporting layer, the second electron transporting layer and the third electron transporting layer comprise a host material, and the host material comprises at least one of 4,7-diphenyl-1,10-phenanthroline and 8-hydroxyquinoline aluminum salt.

12. The tandem organic electroluminescent element according to claim 11, wherein the n type dopant comprises at least one of lithium, sodium, potassium, rubidium, cesium, francium, beryllium, magnesium, calcium, barium, radium, lanthanum, cerium, strontium, neodymium, samarium, europium, terbium, thorium, dysprosium, holmium, erbium, gadolinium, ytterbium, lutetium, yttrium, manganese, and a metal compound of the aforesaid metals.

13. The tandem organic electroluminescent element according to claim 11, wherein a material of the first electron transporting layer and the second electron transporting layer is 4,7-diphenyl-1,10-phenanthroline doped with lithium, and a doping concentration of lithium in the first electron transporting layer is 10 wt %, and a doping concentration of lithium in the second electron transporting layer is 5 wt %; a material of the third electron transporting layer is 8-hydroxyquinoline aluminum salt.

14. The tandem organic electroluminescent element according to claim 11, wherein the first electrode is an anode, and the second electrode is a cathode.

15. The tandem organic electroluminescent element according to claim 11, wherein the charge generation layer comprises an n type charge generation layer disposed adjacent to the first electron transport layer and a p type charge generation layer disposed adjacent to the second light emitting unit.

16. The tandem organic electroluminescent element according to claim 15, wherein a material of the n type charge generation layer is Hexanitrilehexaazatriphenylene, and a material of the p type charge generation layer is N,N'-bis(naphthalen-1-yl)-N,N'-bis(phenyl)benzidine.

17. The tandem organic electroluminescent element according to claim 11, further comprising at least one light emitting unit disposed between the second light emitting unit and the second electrode, and in the second light emitting unit and the at least one light emitting unit, the third electron transporting layer, the second electron transporting layer, the first electron transporting layer and the charge generation layer which are stacked up from bottom to top are disposed between every two adjacent light emitting units.

* * * * *